United States Patent [19]

Hanson et al.

[11] Patent Number: 4,522,667

[45] Date of Patent: Jun. 11, 1985

[54] METHOD FOR MAKING MULTI-LAYER METAL CORE CIRCUIT BOARD LAMINATE WITH A CONTROLLED THERMAL COEFFICIENT OF EXPANSION

[75] Inventors: John R. Hanson, Richmond; James L. Hauser, Lenox; James F. Kilfeather, Jr., Pittsfield; Hendrik B. Hendriks, Becket, all of Mass.

[73] Assignee: General Electric Company, Schenectady, N.Y.

[21] Appl. No.: 443,275

[22] Filed: Nov. 22, 1982

Related U.S. Application Data

[62] Division of Ser. No. 162,827, Jun. 25, 1980, abandoned.

[51] Int. Cl.³ .............. B32B 31/16; B32B 31/06; B32B 31/12; H05K 1/00
[52] U.S. Cl. .................................. 156/87; 29/846; 156/182; 156/313; 156/632; 156/634; 174/68.5; 428/601; 428/901
[58] Field of Search ............... 428/139, 140, 212, 251, 428/416, 458, 544, 596, 597, 607, 901, 902; 29/846; 174/68, 5; 156/52, 87, 182, 313, 630, 632, 634, 629

[56] References Cited

U.S. PATENT DOCUMENTS

| | | | |
|---|---|---|---|
| 1,609,222 | 11/1926 | Taylor | 428/139 |
| 1,766,471 | 6/1930 | Van Dusen | 428/140 |
| 2,217,423 | 10/1940 | Scott | 428/212 |
| 3,113,435 | 12/1963 | Yount | 196/252 |
| 3,345,145 | 10/1967 | Pijls | 428/607 |
| 3,507,739 | 4/1970 | Jacobs | 428/139 |
| 3,666,578 | 5/1972 | Chadsey, Jr. et al. | 428/212 |
| 3,958,317 | 5/1976 | Peart et al. | 428/901 |
| 4,170,819 | 10/1979 | Peter et al. | 428/901 |
| 4,201,616 | 5/1980 | Chellis et al. | 428/901 |

Primary Examiner—William A. Powell
Assistant Examiner—Thomas Bokan
Attorney, Agent, or Firm—Donald J. Voss

[57] ABSTRACT

A multi-layer circuit board laminate is disclosed having a controlled thermal coefficient of expansion which is particularly useful in conjunction with leadless components. The subject invention includes incorporating one or more stabilizing metal sheets into a composite multi-layer circuit board laminate assembly. The stabilizing metal sheets function to significantly reduce the circuit board laminate's thermal coefficient of expansion, thereby enabling the laminate to be used in conjunction with leadless electronic components. In addition, a novel method is disclosed for fabricating one embodiment of the subject invention and includes a unique two-step lamination process which permits apertures to be provided in the metal stabilizing layer and allows the bonding epoxy resin to solidify within the apertures, while simultaneously preventing the entrapment of air. In another embodiment of the subject invention the stabilizing layer is formed of a composite metal-dielectric laminate enabling the layer to be provided with a non-contiguous floating type pattern.

5 Claims, 4 Drawing Figures

METHOD FOR MAKING MULTI-LAYER METAL CORE CIRCUIT BOARD LAMINATE WITH A CONTROLLED THERMAL COEFFICIENT OF EXPANSION

This application is a division application of Ser. No. 162,827, now abandoned.

The subject invention relates to a multi-layer circuit board laminate which includes one or more stabilizing metal sheets for reducing the thermal coefficient of expansion of the laminate. In addition, a novel two-step fabrication method is disclosed which permits apertures to be provided in the metal stabilizing layer and prevents the entrapment of air in those apertures as they are filled with epoxy.

BACKGROUND OF THE INVENTION

In the prior art, printed circuit board laminates have been utilized as a convenient and low cost means for mounting and interconnecting discrete electrical components. More specifically, printed circuit boards, formed of a dielectric substrate, are provided with conductive metallic pathways which define electrical connections between discrete components mounted thereon. The metal leads of the components may be soldered to the conductive pathways to complete the electrical connections.

The dielectric substrate used to form the printed circuit board is generally glass fiber cloth which has been impregnated with a resin formulation, such as epoxy or polyimide. The thermal coefficient of expansion of the dielectric substrate is significantly greater than that of the discrete components. The dissimilarity between the thermal expansion coefficients has not presented an insurmountable problem heretofore, since the flexibility of the metal leads of the discrete components would compensate for the thermal mismatch. Even in situations where the circuit assemblies are subjected to frequent and great thermal changes or excursions, a manufacturer can compensate for the thermal mismatch by providing a circuit layout design which incorporates expansion loops in the component leads to absorb the varied expansions and contractions of the elements thereby preventing stress on the solder joints which is a major cause of circuit failure.

Recently, manufacturers have developed leadless components such as chip resistors or chip capacitors. When the leadless chip components, generally formed from alumina, are directly affixed to a circuit board or to a conductive layer in a multi-layer laminate assembly, it has been found that the difference in thermal coefficients of expansion between the dielectric substrate and the alumina leadless chip components, has resulted in a high degree of circuit failures. More specifically, the thermal coefficient of expansion for a conventional epoxy glass laminate dielectric substrate is in the range of $15-20 \times 10^{-6}$ inch per inch per degree Celsius. In contrast, the alumina chip components have a much lower thermal coefficient of expansion, generally about $6 \times 10^{-6}$ inch per inch per degree Celsius. Thus, when a circuit board laminate having leadless components is subjected to high thermal excursions, solder joints between the components and the laminate frequently failed since there was no flexibility between the components and the laminate to compensate for the varying amounts of expansion. Therefore, it is apparent that it would be desirable to provide a circuit board laminate having thermal coefficient of expansion which more closely matches the thermal coefficient of expansion of the alumina chip components to prevent failures of the electrical connections. Further, it would be desirable to provide a circuit board laminate which continues to utilize glass epoxy substrates for the circuit board construction since the latter offers considerable cost advantages and are relatively easy to manufacture.

Accordingly, it is an object of the subject invention to provide a new and improved multi-layer circuit board laminate having a lowered thermal coefficient of expansion which is particularly useful in conjunction with leadless components.

It is a further object of the subject invention to provide a multi-layer circuit board laminate which includes one or more metal core layers for reducing the thermal coefficient of expansion of the laminate.

It is another object of the subject invention to provide a multi-layer circuit board laminate which utilizes a metal core to reduce the thermal coefficient of expansion and which includes a conventional glass epoxy printed circuit board, thereby retaining the advantages of the latter.

It is still a further object of the subject invention to provide a new and improved method for making a multi-layer circuit board laminate which includes a metal layer that reduces the thermal coefficient expansion of the laminate.

It is still another object of the subject invention to provide a multi-layer circuit board laminate which includes a stabilizing layer formed of a composite, metal-dielectric laminate enabling the layer to be provided with a non-contiguous floating-type pattern.

BRIEF DESCRIPTION OF THE INVENTION

In accordance with the above stated objects, a new and improved metal circuit board laminate is disclosed having a reduced thermal coefficient of expansion which is particularly suitable for use in conjunction with leadless components. More specifically, a circuit board laminate is disclosed having a plurality of planar layers which are adhesively connected in a laminate structure via bonding layers formed of epoxy impregnated glass cloth. In a preferred embodiment, the circuit board laminate of the subject invention includes an uppermost planar metallic conductive layer formed of copper foil and a stabilizing layer formed of a metal having a thermal coefficient of expansion less than thermal coefficient of expansion that the composite laminate structure alone would have. A printed circuit board layer, as used in conventional multi-layer applications, is provided and is disposed below the metal stabilizing layer. A lowermost planar metallic conductive layer, similar to the uppermost layer, is disposed below the printed circuit board layer. Both the uppermost and lowermost metallic conductive layers are adapted to accept leadless alumina components. Bonding sheets, formed of resin impregnated glass cloth, are interposed between each of the layers. In accordance with the new and improved method for producing the subject invention initially, the uppermost planar metallic conductive layer and the metal stabilizing layer are separately laminated to form a partial composite structure. Thereafter, the partial composite structure is laminated to the remaining layers to form a complete composite laminate. This unique two-step lamination process insures that thru holes formed in the stabilizing layer will be filled with resin thereby preventing air from becoming trapped therein, as more fully described hereinafter. The resulting circuit board laminate has a thermal coefficient of expansion which is significantly reduced enabling the laminate to be used with leadless components. In another embodiment of the subject invention, the stabilizing layer is formed of a composite metal-dielectric laminate enabling the layer to be provided with a non-contiguous, floating type pattern.

Further objects and advantages of the subject invention will become apparent when taken in conjunction with the detailed description and the accompanying drawings in which.

DESCRIPTION OF THE PREFERRED EMBODIMENT

Figure 1:
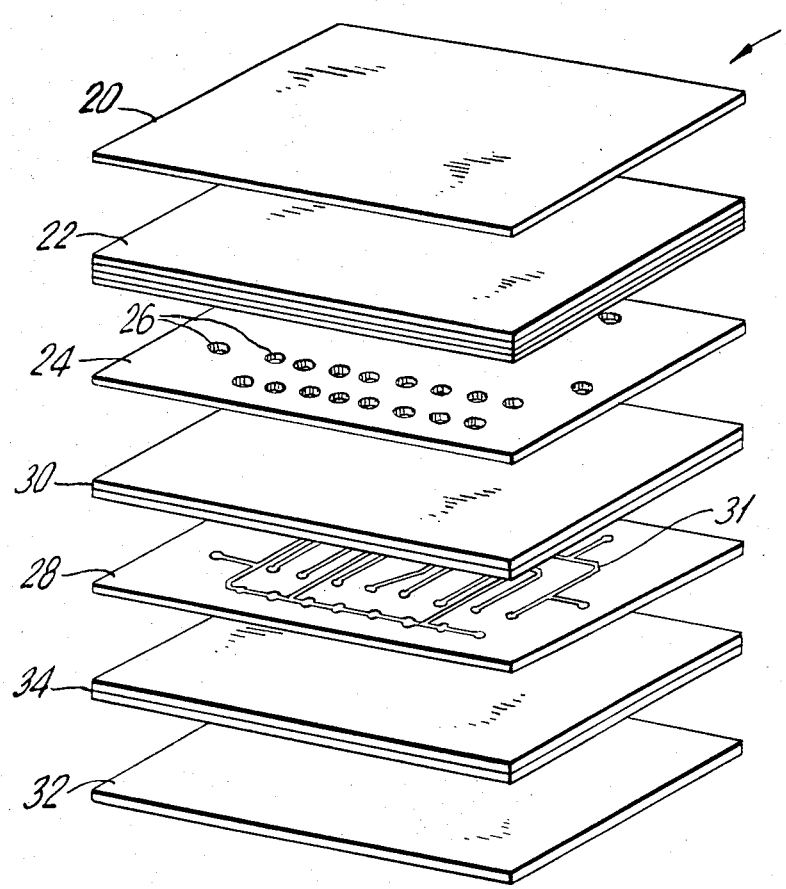
FIG. 1 is an exploded view of the components of the multi-layer circuit board laminate of a first embodiment of the subject invention.

Referring to FIG. 1, an exploded view of the multi-layer circuit board laminate of the subject invention is illustrated and is referred to generally by the numeral 10. The laminate consists of an uppermost layer 20 of a conductive metallic material, preferably formed of a copper foil approximately 0.002 inches thick.

Underneath the metallic layer 20 a plurality of bonding sheets 22 are provided which are formed from conventional multi-laminate board material such as resin impregnated fiberglass cloth. The bonding sheets 22 serve as an adhesive and an electrical insulating dielectric material between the metallic layer 20 and the metal stabilizing layer 24 therebelow. The selection of the metal utilized in stabilizing layer 24, which has a lower thermal coefficient of expansion relative to the dielectric layers, is based on the desired coefficient of expansion of the final composite laminate. Prior to lamination, the stabilizing layer 24 is processed for profile and provided with enlarged apertures 26 to provide clearance in the later stages of fabrication when connective thru holes are drilled and plated. In a preferred embodiment of the subject invention, the stabilizing layer 24 is copper plated such that it is suitable for use as a ground or voltage plane, in addition to its primary function of stabilization. Both the upper and lower surfaces of the stabilizing layer 24 may be coated with a layer of copper oxide to promote adhesion to the bonding sheets above and below.

A conventional printed circuit board 28 is provided beneath the stabilizing layer 24, with a second bonding layer 30 being disposed therebetween. The printed circuit board is of conventional multi-layered design and is preferably formed of glass cloth which is impregnated with a polyimide or epoxy resin. The circuit board is provided with a plurality of electrically conductive pathways 31 which define the circuit pathways to the components. It is to be understood that while an interior circuit board layer 28 is illustrated, it is intended that the scope of the subject invention includes any multilayer laminate structure, where for example, the circuit paths could be provided by etching the upper and/or lower metallic layers 20 and 32.

A lowermost conductive metallic layer 32 is provided with a third bonding layer 34 being interposed between the lowermost conductive layer 32 and the printed circuit board 28. Both the second and third bonding layers 30 and 34, similar to bonding layers 22, are formed from epoxy impregnated glass cloth. The lowermost conductive layer 32, similar to the uppermost conductive layer 20, is preferably formed of copper foil which is 0.002 inches thick. The upper surface of the conductive layer 20 may be pretreated with copper oxide to promote adhesion. Both the uppermost and lowermost conductive layers 20 and 32 are adapted to be used in conjunction with leadless alumina components 44, as well as conventional components 36, as illustrated in FIG. 3.

In accordance with the subject invention, a new fabrication process is disclosed for the manufacture of the multi-layer circuit board of the subject invention. More particularly, the prior art methods for fabricating multi-layer boards cannot be directly adapted to the subject invention, since the subject invention includes a metal stabilizing layer 24 having relatively large apertures 26 which must be completely filled with epoxy resin during the lamination process. Further, the procedure must prevent any entrapment of air in the apertures. Accordingly, applicant's new method includes a two-step fabrication process wherein the uppermost metallic layer 20 and the metal stabilizing layer 24 are initially heated and bonded to provide a partial laminate structure, and thereafter the remaining layers are combined and heated to produce a complete laminate structure. More specifically, in the first lamination step, one or more bonding layers 22, formed of resin impregnated glass cloth, are interposed between the upper metallic layer 20 and the metal stabilizing layer 24. A relatively large amount of epoxy resin is required to completely fill all the apertures 26 in the metal plane. The metallic and stabilizing layers 20, 24 are then laminated such that the resin in the bonding sheets 22 fill up apertures 26, thereby forming a partial laminate structure. This separate, initial lamination step permits the resin to freely flow into apertures 26 without the risk of entrapping air therein, as illustrated in FIG. 2.

Figure 3:
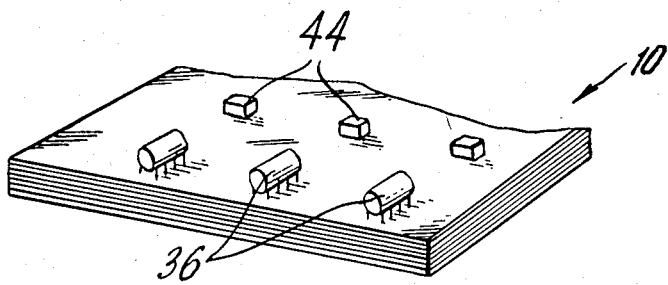
FIG. 3 is a partial view of the completed multi-layer circuit board laminate of the subject invention illustrating the mounting of both conventional and leadless components thereon.

In the second lamination step, the remaining layers are united with the partial lamination structure and laminated to produce a complete laminate structure, as illustrated in FIG. 3. Conventional methods are used to complete the final fabrication such as the drilling and plating of thru holes which facilitate the formation of the electrical connections. Thereafter, the metallic layers 20, 32 may be etched and provided with termination pads for leadless components in accordance with standard multi-layer circuit board fabrication.

Figure 2:
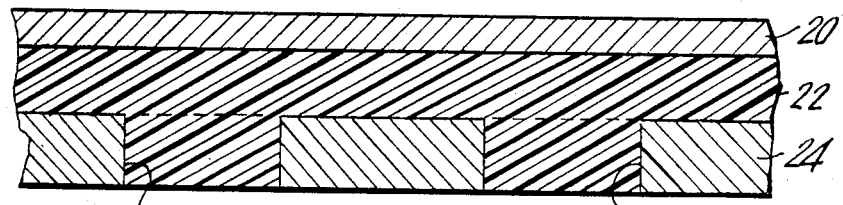
FIG. 2 is a partial cross sectional view of the partial composite laminate structure which results after the first step of the new and improved process for fabricating the subject invention.

Test results of the multi-layer circuit board laminate of the subject invention, as illustrated in FIGS. 1-3, utilizing metal stabilizing layers having thicknesses ranging from 0.005 to 0.015 inches, produced an average thermal coefficient of expansion of approximately $8.9 \times 10^{-6}$ inch per inch per degree Celsius over a range of $-55$ to 125 degrees Celsius. The multi-layer circuit board laminates, assembled with leadless chip carrier components, withstood more than 400 thermal stress cycles per Mil Std 202 (thermal cycling of assembled circuits between −55 and 125 degress Celsius) with no failures in 2000 solder joints.

Figure 4:
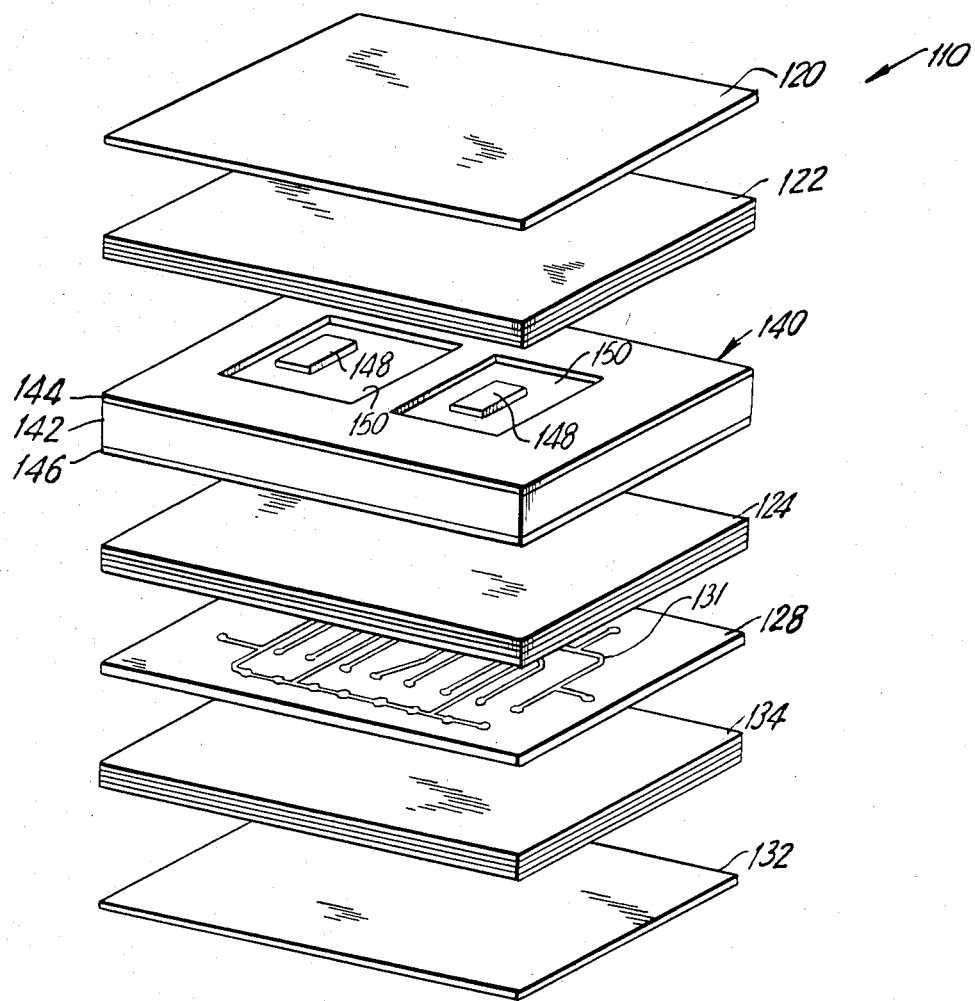
FIG. 4 is an exploded view, similar to FIG. 1, illustrating a second embodiment of the multi layer circuit board of the subject invention, illustrating an alternate form of the stabilizing layer wherein a composite metal-dielectric structure it utilized enabling the layer to be provided with a non-contiguous pattern.

Referring to FIG. 4, there is illustrated a second embodiment of the subject invention, which, similar to the first embodiment, includes a plurality of layers which may be laminated to form a multi-layer metal core circuit board having a controlled thermal coefficient of expansion. More particularly, circuit board 110 includes upper and lower copper foil layers 120 and 132 having a thickness of approximately 0.002 inch. A circuit board layer 128 may be provided which is formed of a dielectric substrate, and includes electrically conductive pathways 131 formed thereon. A plurality of layers of bonding sheets 122, 124 and 134 are interposed between the other layers to act as a dielectric and to supply the epoxy resin necessary to secure the laminate structure.

In the second embodiment of the subject invention, a composite stabilizing layer 140, having low thermal coefficient of expansion characteristics, is disclosed. More specifically, stabilizing layer 140 consists of a central dielectric substrate 142 and two outer metallic core layers 144 and 146, laminated together to form a composite structure. The dielectric substrate layer 142 may be a resin impregnated glass cloth, while the metal core layers 144 and 146, each having a thickness in the range of 0.003 to 0.010 inches, are selected based on the desired expansion characteristics of the final circuit board laminate.

The stabilizing layer 140 of the second embodiment of the subject invention provides certain advantages over a single layer metal core stabilizing layer. More specifically, and as illustrated in FIG. 4, the configuration of the pattern formed in the metal core 144 does not have to be contiguous with the core panel, since the entire core is supported by a dielectric substrate. Stated differently, the stabilizing layer 140 may be provided with a "floating type" core pattern which may include, for example, portions 148 that are non-contiguous with the remainder of the core 144. Another advantage of the composite stabilizing layer 140 is that during the lamination process the relatively large open areas 150 of the core layers are more easily filled with resin. Thus, the danger of air being entrapped in the open areas 150 is significantly reduced, enabling the layers to be laminated in a single step. As in the first embodiment of the subject invention, stabilizing layer 140 may be plated with an electroconductive metal, enabling the layer to act as a ground or voltage plane.

In summary, there is provided a new and improved multi-layer circuit board laminate and method of making the same having a reduced thermal coefficient of expansion which is particularly useful in conjunction with leadless components. More particularly, a multi-layer circuit board laminate is disclosed having one or more metal stabilizing layers incorporated therein. The circuit board laminate includes uppermost and lowermost layers which are adapted to accept leadless components. Sandwiched between the metallic layers is a conventional printed circuit board layer, and one or more stabilizing layers formed from a metal having a low thermal coefficient of expansion. A plurality of bonding sheets, formed of resin impregnated glass cloth, are interposed between each of the above stated layers to act as an adhesive. In the novel fabrication process, the uppermost metallic layer is initially laminated with the metal stabilizing layer such that the resin in the bonding sheets can flow freely into the apertures provided in the metal stabilizing layer without the risk of entrapping air therein. A partial laminate structure is formed which is then laminated with the remaining layers to form a complete composite laminate structure. The latter structure may be finished according to conventional fabrication methods. The subject invention functions to reduce the thermal coefficient of expansion of the circuit board laminate such that it may be used in conjunction with alumina components which also have low thermal coefficient of expansion characteristics. Further, the use of the metal stabilizing plane provides excellent surface conditions for multi-layer board laminates and in addition, can perform as a ground or voltage plane.

Although the subject invention has been described by reference to preferred embodiments, it will be apparent that many other modifications could be devised by those skilled in the art that would fall within the spirit and scope of the present invention as defined by the appended claims.

We claim:

1. A method of making a multi-layer metal core circuit board laminate having a thermal coefficient of expansion less than that of a non-metal core laminate and conductive layers for use with leadless components, said method comprising the steps of:
   a. providing an uppermost planar copper foil conductive layer and a stabilizing layer formed of a metal having a thermal coefficient of expansion less than that of the non-metal portions of the laminate and copper conductive layer;
   b. providing a bonding layer interposed between said copper conductive layer and said stabilizing layer, said bonding layer being formed of resin impregnated glass cloth;
   c. laminating said layers to form a partial composite laminate structure;
   d. providing a printed circuit board layer and a lowermost planar copper foil layer;
   e. providing a second bonding layer between said printed circuit board layer and said lowermost copper foil layer;
   f. providing a third bonding layer between the lower surface of said stabilizing layer and the upper surface of said printed circuit board layer, said second and third bonding layers being formed of resin impregnated glass cloth; and
   g. laminating said layers to provide a complete composite laminate structure having a thermal coefficient of expansion less than that of the bonding layers and the copper conductive layers.

2. The method of claim 1 wherein the thickness of the metal stabilizing layer is from about 0.005 to about 0.015 inches.

3. The method of claim 1 wherein the resin is an epoxy resin.

4. The method of claim 2 wherein the metal stabilizing layer is coated with copper oxide on at least one surface.

5. The method of claim 1 wherein at least two metal stabilizing layers separated by resin impregnated glass are laminated first to produce the metal having a thermal coefficient less than that of the non-metal portions of the laminate.

* * * * *